United States Patent [19]

Enomoto et al.

[11] Patent Number: 4,883,975

[45] Date of Patent: Nov. 28, 1989

[54] SCHMITT TRIGGER CIRCUIT

[75] Inventors: Hiromu Enomoto, Sendai; Hirofumi Dohgome, Kokubu; Masao Kumagai, Sendai; Toru Nakamura, Kushikino; Kimitaka Yoshiyama, Kagoshima, all of Japan

[73] Assignees: Fujitsu Limited, Kawasaki; Kyushu Fujitsu Electronics Limited, Kagoshima, both of Japan

[21] Appl. No.: 268,880

[22] Filed: Nov. 8, 1988

[30] Foreign Application Priority Data

Nov. 17, 1987 [JP] Japan .................................. 62-290177

[51] Int. Cl.$^4$ ........................ H03K 3/29; H03K 5/153; H03K 5/00; H03K 5/12

[52] U.S. Cl. .................................... 307/290; 307/359; 307/542; 307/555; 307/559; 307/565; 307/263; 307/268

[58] Field of Search ............... 307/290, 359, 542, 555, 307/559, 565, 263, 268

[56] References Cited

U.S. PATENT DOCUMENTS 4,409,495 10/1983 Enomoto et al. .................... 307/290
4,567,380 1/1986 Yasuda et al. ....................... 307/290

FOREIGN PATENT DOCUMENTS 0073712 4/1988 Japan .................................. 307/290

Primary Examiner—Stanley D. Miller
Assistant Examiner—Trong Q. Phan
Attorney, Agent, or Firm—Staas & Halsey

[57] ABSTRACT

A Schmitt trigger circuit has a first transistor for inversion having a base supplied with an input voltage. A level shift diode shifts an emitter voltage of the first transistor from a reference level, and a second transistor for switching has a collector and an emitter respectively coupled to an anode and a cathode of the level shift diode. The emitter of the second transistor is coupled to a first power source voltage. A switching part is coupled between a base of the second transistor and a second power source voltage higher than the first power source voltage, for controlling switching of the second transistor. An output circuit is coupled between the first and second power source voltages and supplied with the input voltage through the first transistor for outputting the output voltage. The switching part is controlled responsive to a voltage from the output circuit so as to close when the logic level of this voltage is the high level, thereby turning the second transistor ON.

20 Claims, 7 Drawing Sheets

SCHMITT TRIGGER CIRCUIT

BACKGROUND OF THE INVENTION

The present invention generally relates to Schmitt trigger circuits, and more particularly to a Schmitt trigger circuit having a satisfactory hysteresis characteristic.

A Schmitt trigger circuit has a hysteresis characteristic in which a threshold voltage $V_T^+$ is high with respect to a rise of an input voltage and a threshold voltage $V_T^-$ is lower than the threshold voltage $V_T^+$ with respect to a fall of the input voltage. Due to this hysteresis characteristic, a noise margin of the Schmitt trigger circuit is high and the Schmitt trigger circuit can prevent oscillation in a vicinity of a fixed threshold voltage. Hence, the Schmitt trigger circuit is suited for use in a long transmission path since noise easily mixes into the long transmission path and a signal waveform is often distorted in the long transmission path.

In the Schmitt trigger circuit, it is desirable to suppress an increase in an input current $I_{IL}$ which is generated when the input voltage falls from the high level to the low level, the reason being that a load on a driver which drives the Schmitt trigger circuit becomes large when the input current $I_{IL}$ is large. For example, the Schmitt trigger circuit is used in each bus line of a personal computer. Accordingly, when there are ten bus lines, for example, a total of the input currents $I_{IL}$ of ten Schmitt trigger circuits becomes large when the input current $I_{IL}$ increases, thereby making the load on the driver considerably large as a whole.

FIG. 1 shows an example of a conventional Schmitt trigger circuit. This Schmitt trigger circuit has an input stage PNP transistor T1, a Schottky barrier clamped NPN transistor T2 for inversion, a Schottky barrier clamped NPN transistor T3 for setting the hysteresis, a Schottky barrier clamped NPN transistor T4 for controlling the transistor T3, output stage NPN transistors T5 through T*, diodes D1, D2 and Ds1, and resistors R1 through R7 which are connected as shown. The transistors T5, T6 and T8 are Schottky barrier clamped NPN transistors. The diodes D1 and D2 are each constituted by an NPN transistor having a base and a collector thereof short-circuited. The diode Ds1 is a Schottky barrier diode having a cathode connected to an input terminal 1 and an anode connected to a node N1. The node N1 is connected to a base of the transistor T2, an emitter of the transistor T3 and the like. The diode Ds1 is provided for the purpose of extracting a base charge of the transistor T2.

When an input voltage $V_{IN}$ applied to the input terminal 1 has a low level (for example, 0 V), an emitter voltage of the transistor T1 is only $V_{BET1}$ higher than the low-level input voltage $V_{IN}$ and the transistor T2 turns OFF, where $V_{BET1}$ is a base-emitter voltage of the transistor T1. Hence, the transistor T5 turns ON, the transistors T6 and T7 forming a Darlington pair both turn OFF, and the transistor T8 for inverting the output turns ON, thereby resulting in a low-level output voltage $V_O$ being outputted from an output terminal 2. In this state, a current flows from the resistor R2 to the transistor T5 through the base and emitter of the transistor T4.

The transistor T2 turns ON when the emitter voltage of the transistor T1 is $V_{BED1}+V_{BED2}+V_{BET2}$ or higher, where $V_{BED1}$ and $V_{BED2}$ respectively denote base-emitter voltages of the transistors constituting the diodes D1 and D2 and $V_{BET2}$ denotes a base-emitter voltage of the transistor T2. Hence, the input voltage $V_{IN}$ needs to be $(V_{BED1}+V_{BED2}+V_{BET2})-V_{BET1}$ or higher in order to turn ON the transistor T2. In other words, when the input voltage $V_{IN}$ is $(V_{BED1}+V_{BED2}+V_{BET2})-V_{BET1}$ or higher, the transistor T2 turns ON, the transistor T5 turns OFF, the transistors T6 and T7 both turn ON, and the transistor T8 turns OFF, thereby resulting in a high-level output voltage $V_O$ being outputted from the output terminal 2. Thus, $(V_{BED1}+V_{BED2}+V_{BET2})-V_{BET1}$ corresponds to a threshold voltage $V_T^+$ of the Schmitt trigger circuit when switching the output voltage $V_O$ from the low level to the high level.

In this state, a current flowing through the resistor R2 is supplied to the base of the transistor T3 through the base and collector of the transistor T4, and the transistor T3 turns ON. A collector-emitter voltage (saturation voltage) $V_{CET3}$ of the transistor T3 in the ON state is lower than the base-emitter voltage $V_{BED1}$ of the diode D1. For this reason, a current flowing through the resistor R1 is supplied to the base of the transistor T2 through the collector and emitter of the transistor T3.

In a process of the input voltage $V_{IN}$ falling from the high level (for example, 3 V) to the low level, the transistor T2 turns OFF under the condition that the input voltage $V_{IN}$ is $(V_{BED2}+V_{BET2}+V_{CET3})-V_{BET1}$, where $V_{CET3}$ denotes a collector-emitter voltage of the transistor T3. This voltage $(V_{BED2}+V_{BET2}+V_{CET3})-V_{BET1}$ corresponds to a threshold voltage $V_T^-$ of the Schmitt trigger circuit when switching the output voltage $V_O$ from the high level to the low level. When it is assumed that the base emitter voltages of the transistors T1 and T2 and the diodes D1 and D2 are the same and respectively denoted by $V_{BE}$, because $V_{CET3}$ is smaller than $V_{BE}=V_{BED1}$, the threshold voltage $V_T^-$ is lower than the threshold voltage $V_T^+$. Therefore, the relationship between the input voltage $V_{IN}$ and the output voltage $V_O$ becomes as shown in FIG. 2 which is a hysteresis characteristic.

On the other hand, FIG. 3 shows a Schmitt trigger circuit proposed in a Japanese Published Patent Application No. 58-47093. In FIG. 3, those parts which are essentially the same as those corresponding parts in FIG. 1 are designated by the same reference numerals, and a description thereof will be omitted. This proposed Schmitt trigger circuit differs from the conventional Schmitt trigger circuit shown in FIG. 1 in that a multi-emitter PNP transistor T9 is used in the input stage and the diode Ds1 is omitted. A first emitter E1 of the transistor T9 is connected to the resistor R1, while a second emitter E2 of the transistor T9 is connected directly to the base of the transistor T2.

According to the proposed Schmitt trigger circuit shown in FIG. 3, a sum $(V_{CET3}+V_{BET92})$ of the collector-emitter voltage $V_{CET3}$ of the transistor T3 and a voltage $V_{BET92}$ across a base and the second emitter E2 of the transistor T9 is higher than a voltage $V_{BET91}$ across the base and the first emitter E1 of the transistor T9 in the process of the input voltage $V_{IN}$ falling from the high level to the low level. Hence, the input current $I_{IL}$ always flows through the transistor T9 even when the level of the input voltage $V_{IN}$ falls and the transistor T9 turns ON, and the input current $I_{IL}$ is small.

But in the process of the input voltage $V_{IN}$ falling from the high level to the low level in the conventional Schmitt trigger circuit shown in FIG. 1, a sum ($V_{CET3}+V_F$) of the collector-emitter voltage $V_{CET3}$ of the transistor T3 and a forward drop voltage $V_F$ of the diode Ds1 is approximately equal to the base-emitter voltage $V_{BET1}$ of the transistor T1. For this reason, at a time immediately before the transistor T5 turns ON and the transistor T3 turns OFF when $V_{IN}=2V_{BE}-V_F$, a current flows from the resistor R1 to not only the base of the transistor T2 through the collector and emitter of the transistor T3 but also to the input terminal 1 through the diode Ds1 although for a short time. In this state, the input current $I_{IL}$ is a sum of the base current of the transistor T1 and the forward current of the diode Ds1.

When the input voltage $V_{IN}$ becomes lower than the threshold voltage $V_T{}^-$, the transistor T3 turns OFF and the forward current of the diode Ds1 does not flow. In this case, the input current $I_{IL}$ consists solely of the base current of the transistor T1.

The forward current of the diode Ds1 is a relatively large current, and thus makes the input current $I_{IL}$ large. This is because, when a current amplification of the transistor T1 is denoted by B1 and a current flowing through the resistor R1 is denoted by Ia, the base current of the transistor T1 is a Ia/B1 while the forward current of the diode Ds1 is not multiplied by 1/B1.

FIG. 4 shows simulation results obtained for the input current $I_{IL}$ of the conventional Schmitt trigger circuit shown in FIG. 1, where a power source voltage Vcc is set to 5.0 V and the low level and the high level of the input voltage $V_{IN}$ are respectively set to 0 V and 3 V. It can be seen from FIG. 4 that a peak value of the input current $I_{IL}$ is approximately $-2.2$ mA which is considerably large. Hence, there is a problem in that this large input current $I_{IL}$ results in a large load when viewed from the input side.

On the other hand, in the proposed Schmitt trigger circuit shown in FIG. 3, it is possible to suppress the increase of the input current $I_{IL}$ in the pulse form in the process of the input voltage $V_{IN}$ falling from the high level to the low level. But the level at which the base charge of the transistor T2 is extracted, that is, the base voltage of the transistor T2 must be less than or equal to the sum ($V_{BET2}+V_{BED2}$) of the base-emitter voltages of the transistor T2 and the diode D2. This means that the input voltage $V_{IN}$ applied to the input terminal 1 must be ($V_{BET2}+V_{BED2})-V_{BET92}$ or less in order to cut off the transistor T2. For this reason, comopared to the input voltage $V_{IN}$ of the conventional Schmitt trigger circuit shown in FIG. 1 which is ($V_{BET2}+V_{BED2})-V_F$, the input voltage $V_{IN}$ of the proposed Schmitt trigger circuit shown in FIG. 3 is $V_{BET92}-V_F$ lower. When it is assumed that the base-emitter voltages of the transistors T2 and T9 and the diode D2 are the same and respectively denoted by $V_{BE}$, the input voltage $V_{IN}$ of the conventional Schmitt trigger circuit is $2V_{BE}-V_F$ while the input voltage $V_{IN}$ of the proposed Schmitt trigger circuit is $V_{BE}$ and $V_{BE}-V_F$ lower. As a result, it takes time for the transistor T2 to switch from the ON state to the OFF state in the proposed Schmitt trigger circuit, and there is a problem in that the switching speed is slow.

SUMMARY OF THE INVENTION

Accordingly, it is a general object of the present invention to provide a novel and useful Schmitt trigger circuit in which the problems described above are eliminated.

Another and more specific object of the present invention is to provide a Schmitt trigger circuit in which an increase in an input current as an input voltage falls is reduced and a switching speed is high.

Still another object of the present invention is to provide a Schmitt trigger circuit for outputting an output voltage having a logic level which changes from a low level to a high level at a first threshold value of an input voltage and a logic level which changes from the high level to the low level at a second threshold value of the input voltage, comprising a first transistor for inversion having a base supplied with the input voltage, a level shift diode for shifting an emitter voltage of the first transistor from a reference level, a second transistor for switching having a collector and an emitter respectively coupled to an anode and a cathode of the level shift diode, where the emitter of the second transistor is coupled to a first power source voltage, switching means for controlling a switching of the second transistor and coupled between a base of the second transistor and a second power source voltage higher than the first power source voltage, and an output circuit supplied with the input voltage through the first transistor for outputting the output voltage and coupled between the first and second power source voltages, where the switching means is controlled responsive to a voltage from the output circuit so as to close when the logic level of this voltage is the high level, thereby turning the second transistor ON.

A further object of the present invention is to provide a Schmitt trigger circuit for outputting an output voltage having a logic level which changes from a low level to a high level at a first threshold value of an input voltage and a logic level which changes from the high level to the low level at a second threshold value of the input voltage, comprising a first transistor for inversion having a base supplied with the input voltage, a level shift diode for shifting an emitter voltage of the first transistor from a reference level, a second transistor for switching having a collector and an emitter respectively coupled to an anode and a cathode of the level shift diode, where the emitter of the second transistor is coupled to a first power source voltage, switching means for controlling a switching of the second transistor by supplying a control voltage to a base of the second transistor and coupled between the first power source voltage and a second power source voltage higher than the first power source voltage, and an output circuit supplied with the input voltage through the first transistor for outputting the output voltage and coupled between the first and second power source voltages, where the switching means is controlled responsive to a voltage from the output circuit so as to turn the second transistor ON by the control voltage when the logic level of this voltage is the high level.

Another object of the present invention is to provide a Schmitt trigger circuit for outputting an output voltage having a logic level which changes from a low level to a high level at a first threshold value of an input voltage and a logic level which changes from the high level to the low level at a second threshold value of the input voltage, comprising a first transistor for inversion having a base supplied with the input voltage, a level shift diode for shifting an emitter voltage of the first transistor from a reference level, a second transistor for switching having a collector and an emitter respectively coupled to an anode and a cathode of the level shift diode, where the emitter of the second transistor is coupled to a first power source voltage, switching means for controlling a switching of the second transistor by supplying a control voltage to a base of the second transistor and coupled between the base of the second transistor and a second power source voltage higher than the first power source voltage, and an output circuit supplied with the input voltage through the first transistor for outputting the output voltage and coupled between the first and second power source voltages, where the switching means is controlled responsive to a voltage from the output circuit so as to turn the second transistor ON by the control voltage when the logic level of this voltage is the high level.

Other objects and further features of the present invention will be apparent from the following detailed description when read in conjunction with the accompanying drawings.

DETAILED DESCRIPTION OF THE PREFERRED EMBODIMENT

Figure 1:
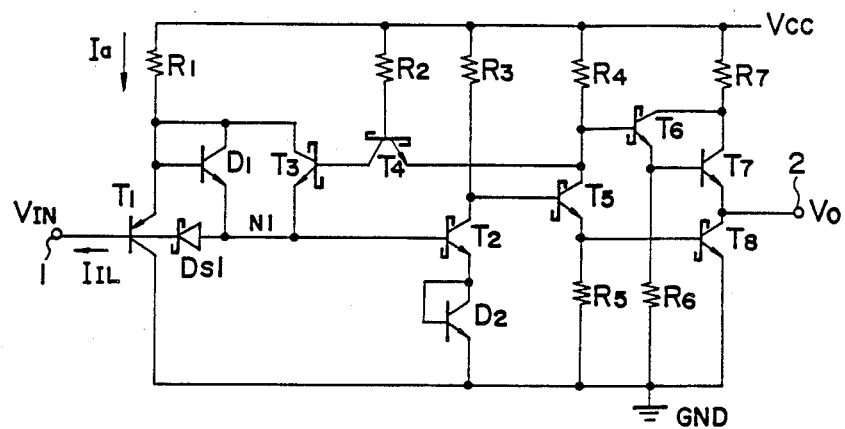
FIG. 1 is a circuit diagram of an example of a conventional Schmitt trigger circuit.
Figure 2:
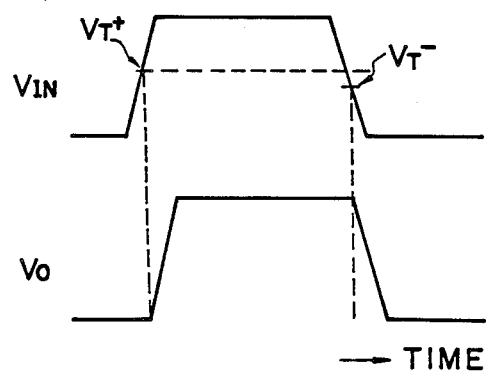
FIG. 2 is a diagram of a hysteresis characteristic of the conventional Schmitt trigger circuit shown in FIG. 1.
Figure 5:
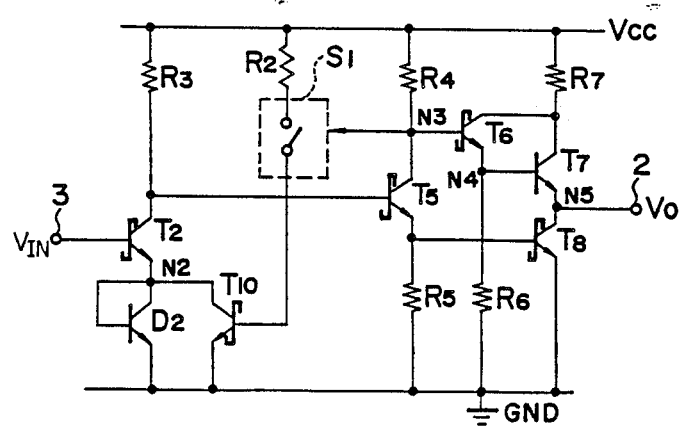
FIG. 5 is a circuit diagram of a Schmitt trigger circuit according to the present invention for explaining an operating principle thereof.
Figure 4:
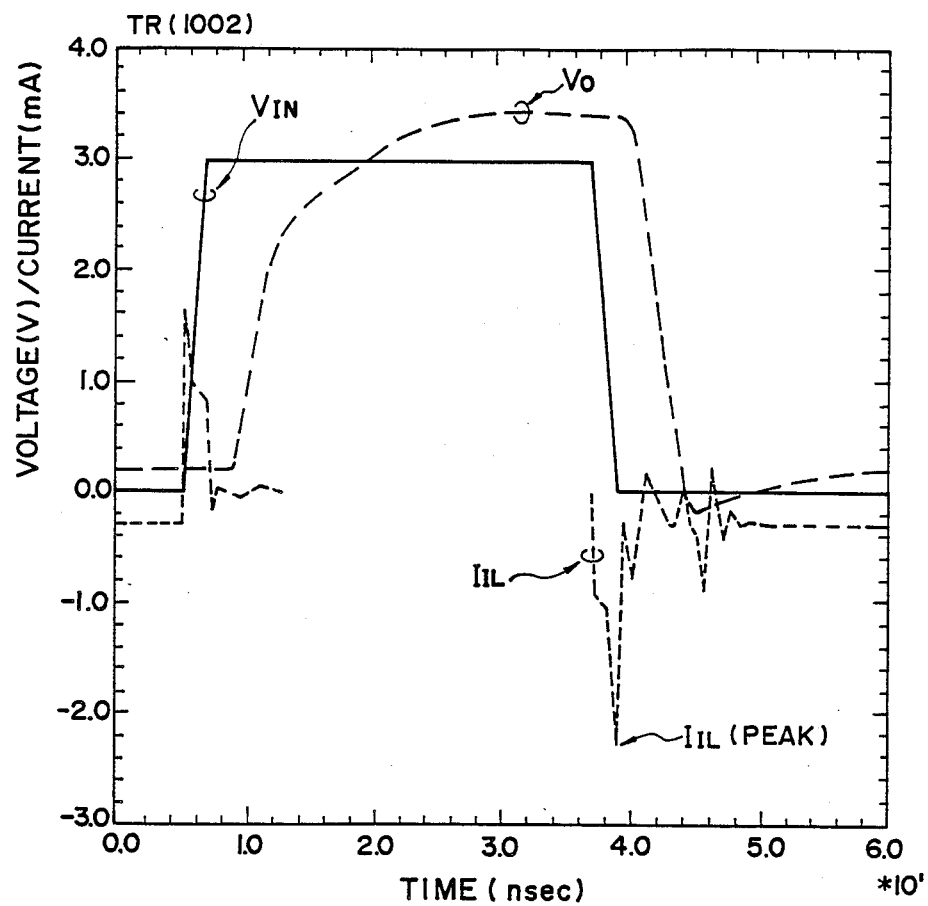
FIG. 4 is a graph of simulation results obtained for an input current of the conventional Schmitt trigger circuit shown in FIG. 1.

FIG. 5 is a circuit diagram of a Schmitt trigger circuit according to the present invention for explaining an operating principle thereof. For convenience sake, those parts in FIG. 5 which are essentially the same as those corresponding parts in FIG. 1 are designated by the same reference numerals, and a description thereof will be omitted. The Schmitt trigger circuit shown in FIG. 5 has a transistor T10 for switching, and a switching means S1.

The diode D2 shifts the level of the emitter voltage of the transistor T2 which is used for inversion from a reference level. The anode of the diode D2 (that is, a node N2 between the base and collector of the transistor constituting the diode D2) is connected to a collector of the transistor T10. The cathode of the diode D2 (that is, an emitter of the transistor constituting the diode D2) is connected to an emitter of the transistor T10. The switching means S1 controls the switching of the transistor T10 depending on a logic value of the output voltage $V_O$ of the Schmitt trigger circuit, for example the output voltage from a node N3. It is also possible to control the switching means S1 by the output voltage fromo a node N4 or N5. Although the output circuit has the transistors T5 through T8, it is possible to employ an open-collector type output circuit having only the transistors T5 and T8 and not the transistors T6 and T7.

When the input voltage $V_{IN}$ applied to an input terminal 3 has the low level, the transistor T2 turns OFF, the transistors T5 and T8 both turn ON, and the transistors T6 and T7 both turn OFF. As a result, a low-level output voltage $V_O$ is outputted from the output terminal 2.

In this state, the switching means S1 is OFF and the transistor T10 thus turns OFF. For this reason, the emitter voltage of the transistor T2 becomes equal to the base-emitter voltage $V_{BED2}$ of the diode D2.

In the process of the input voltage $V_{IN}$ rising from the low level to the high level, when the input voltage $V_{IN}$ becomes higher than a sum $(V_{BED2}+V_{BET2})$ of the base-emitter voltages of the diode D2 and the transistor T2, the transistor T2 turns ON, the transistors T5 and T8 both turn OFF and the transistors T6 and T7 both turn ON. As a result, a high-level output voltage $V_O$ is outputted from the output terminal 2. Hence, the switching means S1 turns ON and a current is applied to the base of the transistor T10 through the resistor R2 and the switching means S1, and the transistor T10 turns ON.

Next, in the process of the input voltage $V_{IN}$ falling from the high level to the low level, when the input voltage $V_{IN}$ becomes lower than a sum $(V_{CET10}+V_{BET2})$ of a collector-emitter voltage $V_{CET10}$ of the transistor T10 in the ON state and the base-emitter voltage $V_{BET2}$ of the transistor T2, the transistor T2 turns OFF and the base charge of the transistor T2 is extracted. In addition, the transistors T5 and T8 both turn ON and the transistors T6 and T7 both turn OFF. As a result, a low-level output voltage $V_O$ is outputted from the output terminal 2. The switching means S1 turns OFF, and the transistor T10 is cut off.

Therefore, according to the Schmitt trigger circuit of the present invention, the steady-state input current $I_{IL}$ which flows when the input voltage $V_{IN}$ has the low level consists only of the base current of the transistor T2, and there does not exist a current path of a current component which increases the input current $I_{IL}$. In addition, because the Schmitt trigger circuit shown in FIG. 5 does not use teh transistor T3 used in the Schmitt trigger circuits shown in FIGS. 1 and 3, the base capacitance of the transistor T2 is small in the Schmitt trigger circuit of the present invention, thereby realizing a high switching speed.

Figure 6:
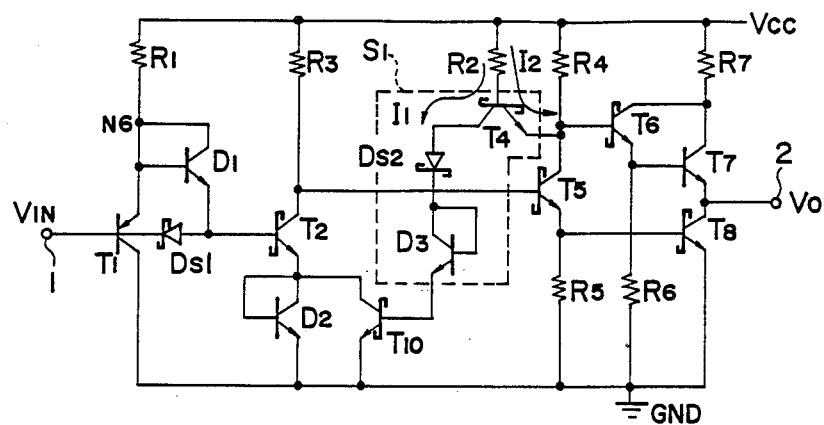
FIG. 6 is a circuit diagram of a first embodiment of the Schmitt trigger circuit according to the present invention.

Next, a description will be given of a first embodiment of the Schmitt trigger circuit according to the present invention, by referring to FIG. 6. In FIG. 6, those parts which are essentially the same as those corresponding parts in FIGS. 1 and 5 are designated by the same reference numerals, and a description thereof will be omitted. In FIG. 5, the switching means S1 is made up of the transistor T4, a Schottky barrier diode Ds2, and a diode D3 constituted by an NPN transistor having a base and a collector thereof short-circuited, as indicated by a phantom line. Unlike in the conventional Schmitt trigger circuit shown in FIG. 1, no transistor T3 is provided, and the transistor T10 is a Schottky barrier clamped NPN transistor having a collector and an emitter thereof respectively connected to the anode and the cathode of the diode D2.

The transistor T10 is OFF when the input voltage $V_{IN}$ has the low level. Accordingly, in the process of the input voltage $V_{IN}$ rising from the low level to the high level, a current starts to flow from the resistor R1 to the base of the transistor T2 through the diode D1 at a time when the input voltage $V_{IN}$ reaches a sum $(V_{BED2}+V_{BET2})$ of the base-emitter voltages of the diode D2 and the transistor T2, and the transistor T2 turns ON. Hence, the base voltage of the transistor T5 drops due to the voltage drop introduced across the resistor R3, and the transistor T5 turns OFF. As a result, the transistors T6 and T7 both turn ON and the transistor T8 turns OFF, and a high-level output voltage $V_O$ is outputted from the output terminal 2.

When the transistor T5 turns OFF, a current I1 from the resistor R2 flows to the base of the transistor T10 through the base and the collector of the transistor T4 and the series connected diodes Ds2 and D3, and the transistor T10 turns ON. In this state, the emitter voltage of the transistor T4 is high, and no current flows from the transistor T4 to the transistors T5 and T6.

Next, in the process of the input voltage $V_{IN}$ falling from the high level to the low level, the input voltage $V_{IN}$ must be $(V_{CET10}+V_{BET2}+V_{BED1})-V_{BET1}$ or less in order to turn OFF the transistor T2, where $V_{CET10}$ denotes the collector-emitter voltage of the transistor T10 in the ON state, and $V_{BET2}$, $V_{BED1}$ and $V_{BET1}$ respectively denote the base-emitter voltages of the transistor T2, the diode D1 and the transistor T1. In other words, when it is assumed that the transistors T2 and T1 and the diode D1 have the same base-emitter voltages which are respectively denoted by $V_{BE}$, the input voltage $V_{IN}$ must be $(V_{CET10}+2V_{BE})-V_{BE}=(V_{CET10}+V_{BE})$ or less in order to turn the transistor T2 OFF.

Accordingly, the output voltage $V_O$ has the low level when the input voltage $V_{IN}$ has the threshold value $V_T^-(=V_{CE}+V_{BE})$, as in the case of the conventional Schmitt trigger circuit shown in FIG. 1. In addition, since the transistor T5 turns ON in this state, a current I2 from the resistor R2 flows through the base and the emitter of the transistor T4, and no current flows to the diode Ds2. For this reason, no current is suplied to the base of the transistor T10 and the transistor T10 is OFF.

Therefore, in the next process of the input voltage $V_{IN}$ rising from the low level to the high level, the threshold value $V_T^+$ becomes equal to $(V_{BED1}+V_{BED2}+V_{BET2})-V_{BET1}$, where $V_{BED2}$ denotes the base-emitter voltage of the diode D2. The threshold value $V_T^+$ is $2V_{BE}$ in the case where the base-emitter voltages of the transistors T2 and T1 and the diodes D1 and D2 are the same and are both denoted by $V_{BE}$. Thus, as in the case of the conventional Schmitt trigger circuit, the Schmitt trigger circuit shown in FIG. 6 has a hysteresis characteristic in which the threshold values $V_T^+$ and $V_T^-$ differ.

According to this embodiment, in the process of the input voltage $V_{IN}$ falling to the low level, the voltage at a node N6 between the resistor R1 and the emitter of the transistor T1 is $(V_{BET1}+V_{IN})$. But the base-emitter voltage $V_{BET1}$ of the transistor T1 is always smaller than the voltage drop $(V_F+V_{BED1})$ across the series connected diodes Ds1 and D1 coupled between the base and the emitter of the transistor T1. Further, there does not exist a current path to the diode Ds1 as in the case of the transistor T3 or the like of the Schmitt trigger circuits shown in FIGS. 1 and 3. Hence, the input current $I_{IL}$ is always a small current consisting solely of the base current of the transistor T1.

Figure 7:
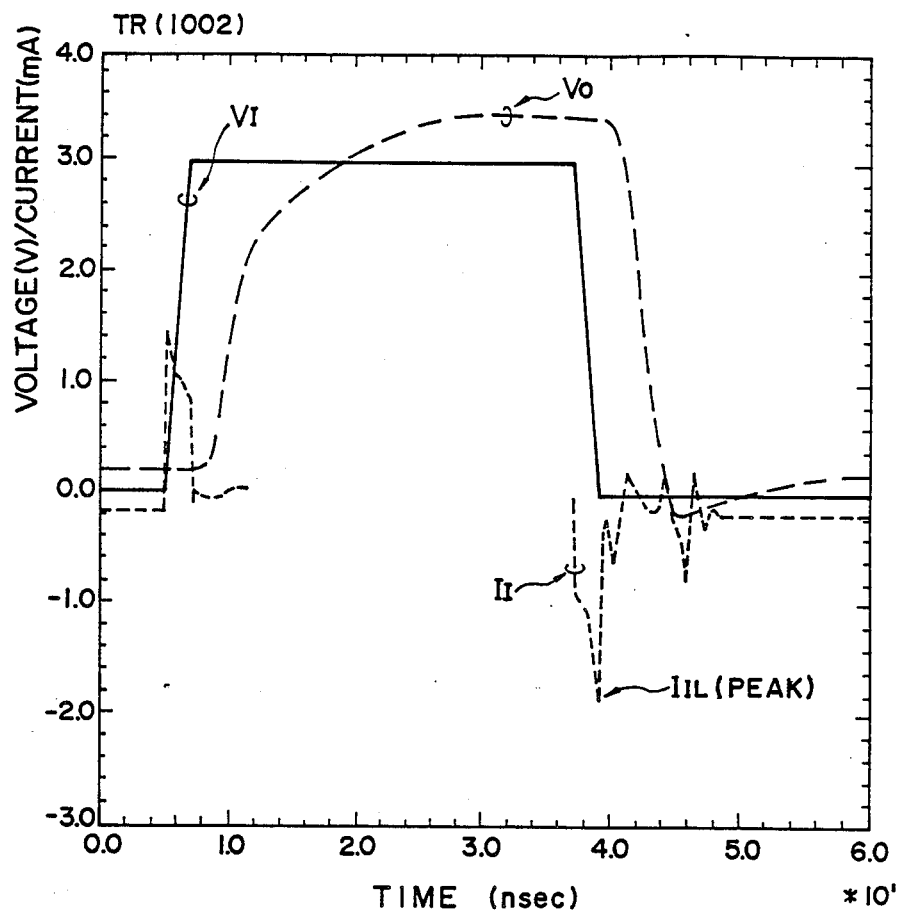
FIG. 7 is a graph of simulation results obtained for an input current of the first embodiment of the Schmitt trigger circuit.

FIG. 7 shows simulation results obtained for an input current of the Schmitt trigger circuit shown in FIG. 6, where a power source voltage Vcc is set to 5.0 V and the low level and the high level of the input voltage $V_{IN}$ are respectively set to 0 V and 3 V. It can be seen from FIG. 7 that a peak value of the input current $I_{IL}$ is approximately $-1.9$ mA which is smaller than that of the conventional Schmitt trigger circuit shown in FIG. 1, and the steady-state value of the input current $I_{IL}$ is also reduced compared to that of the conventional Schmitt trigger circuit shown in FIG. 1. In addition, transition times $t_{PLH}$ and $t_{PHL}$ of the output voltage $V_O$ respectively from the low level to the high level and from the high level to the low level are 4.29 ns and 4.46 ns. Comparing to the corresponding transition times $t_{PLH}$ and $t_{PHL}$ of the output voltage $V_O$ in the conventional Schmitt trigger circuit which respectively are 4.89 ns and 4.35 ns, it was confirmed that this embodiment is effective in reducing the transition time $t_{PLH}$.

Figure 8:
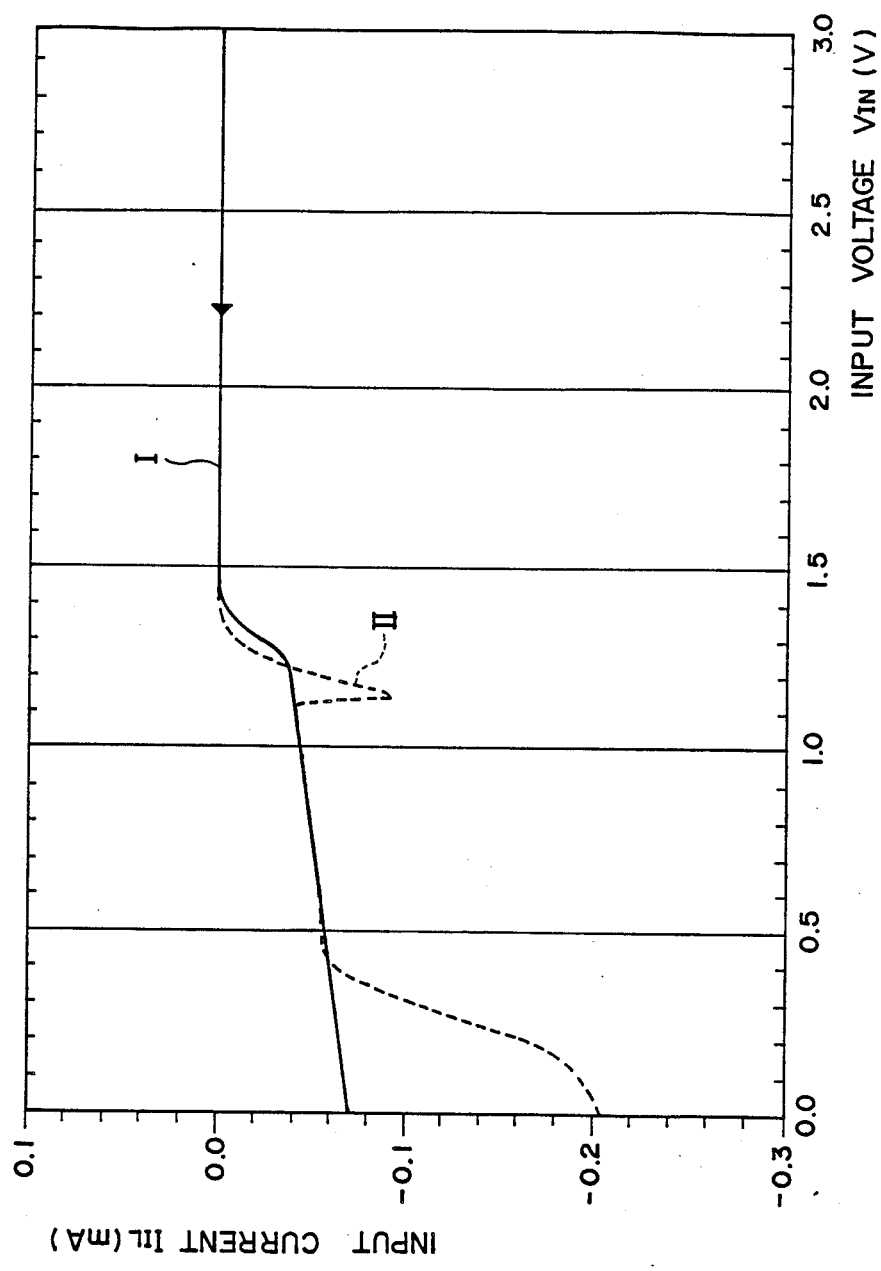
FIG. 8 is a graph of an input current versus input voltage characteristic of the first embodiment for the case where an input voltage changes from a high level to a low level.

FIG. 8 shows an input current versus output voltage characteristic of the first embodiment for the case where the input voltage $V_{IN}$ changes from the high level (3 V) to the low level (0 V). In FIG. 8, the characteristic obtained in the first embodiment is indicated by a solid line I, while a characteristic obtained in the conventional Schmitt trigger circuit shown in FIG. 1 is indicated by a phantom line II for comparison purposes. It may be seen that the input current $I_{IL}$ is stable in the characteristic I compared to the characteristic II.

The base charge of the transistor T2 is extracted when the base voltage of the transistor T2 is $(V_{IN}+V_F)$. But since there is no transistor T3 and the emitter of the transistor T3 is not connected to the base of the transistor T2, the base capacitance of the transistor T2 is accordingly reduced and the switching speed of the transistor T2 increases. Hence, according to this embodiment, the switching speed is improved not only over the proposed Schmitt trigger circuit shown in FIG. 3 but also over the conventional Schmitt trigger circuit shown in FIG. 1.

Figure 9:
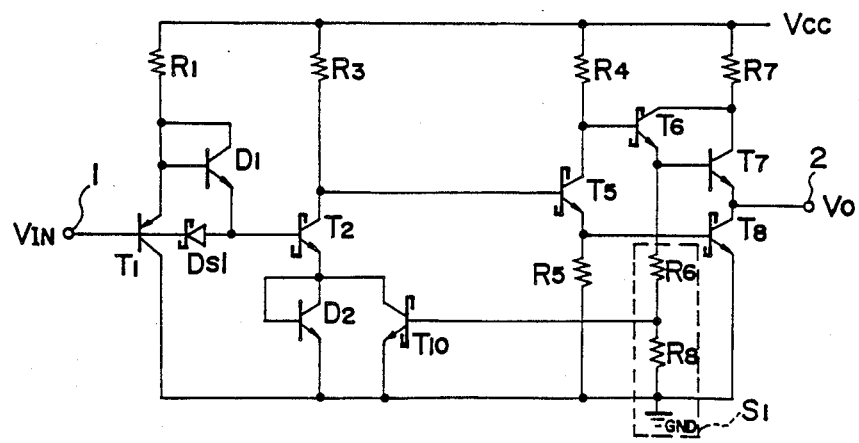
FIG. 9 is a circuit diagram of a second embodiment of the Schmitt trigger circuit according to the present invention.

Next, a description will be given of a second embodiment of the Schmitt trigger circuit according to the present invention, by referring to FIG. 9. In FIG. 9, those parts which are essentially the same as those corresponding parts in FIG. 6 are designated by the same reference numerals, and a description thereof will be omitted. In this embodiment, the switching means S1 is made up of a voltage divider having resistors R6 and R8 coupled to the emitter of the transistor T6, and the transistor T4 and the resistor R2 are omitted.

When the output voltage $V_O$ has the high level in this embodiment, the tranisstor T6 is ON and the emitter current of the transistor T6 flows in division through the resistors R6 and R8. As a result, a voltage is generated across the resistor R8 and the transistor T10 turns ON.

In addition, when the output voltage $V_O$ has the low level, no current flows through the resistors R6 and R8 and no current is supplied to the base of the transistor T10. Thus, the transistor T10 turns OFF.

In this embodiment, the input current $I_{IL}$ also consists solely of the base current of the transistor T1. Furthermore, because no transistor T3 is provided, the base capacitance of the transistor T2 is reduced similarly as in the case of the first embodiment. This second embodiment requires a smaller number of elements compared to the first embodiment.

Figure 10:
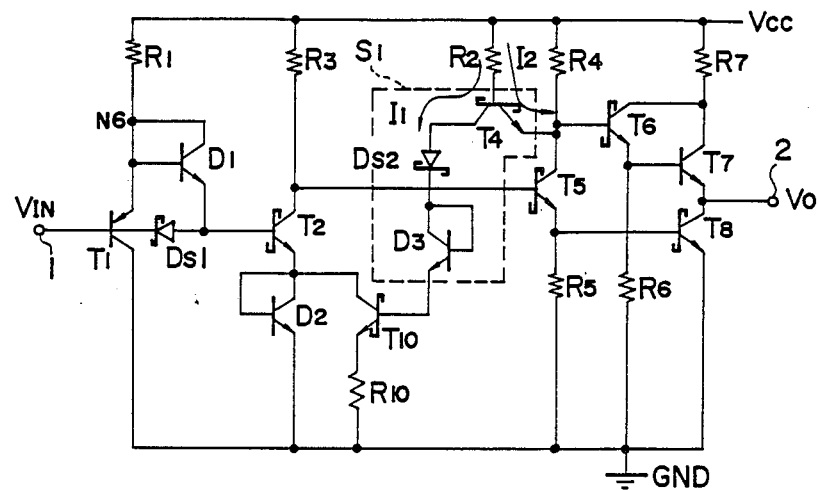
FIG. 10 is a circuit diagram of a first modification of the first embodiment.

In the embodiments described heretofore, it is possible to provide a resistor between the emitter of the transistor T10 and the ground GND. In this case, it is possible to control and increase the threshold voltage $V_T{}^-$. FIG. 10 shows a first modification of the first embodiment wherein a resistor R10 is provided between the emitter of the transistor T10 and the ground GND. In FIG. 10, those parts which are the same as those corresponding parts in FIG. 6 are designated by the same reference numerals, and a description thereof will be omitted.

Figure 11:
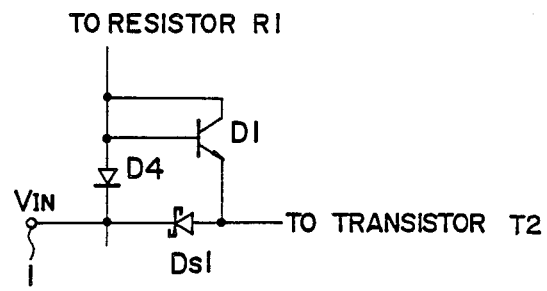
FIG. 11 is a circuit diagram of an essential part of a second modification of the first embodiment.

FIG. 11 shows an essential part of a second modification of the first embodiment. In FIG. 11, those parts which are the same as those corresponding parts in FIG. 6 are designated by the same reference numerals, and a description thereof will be omitted. In this second modification, a diode D4 is provided in place of the transistor T1. A cathode of the diode D4 is connected to a node between the input terminal 1 and the cathode of the diode Ds1, and an anode of the diode D4 is connected to the anode of the diode D1 (that is, a node between the base and collector of the transistor constituting the diode D1).

It is evident that the first and second modifications to the first embodiment may similarly be applied to the second embodiment.

Figure 3:
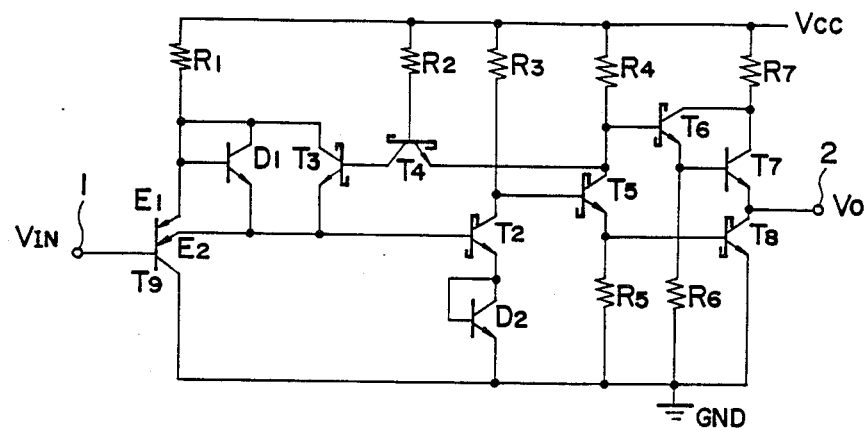
FIG. 3 is a circuit diagram of a proposed Schmitt trigger circuit.

In the conventional and proposed Schmitt trigger circuits shown in FIGS. 1 and 3, the base voltage of the transistor T5 is determined by the collector-emitter voltage of the transistor T2 and the base-emitter voltage of the diode D2, and the base voltage of the transistor T5 is approximately 1.2 V, for example. But according to the present invention, the base voltage of the transistor T5 can be lowered by the collector-emitter voltage of the transistor T10, and the base voltage of the transistor T5 is 0.8 V, for example. Therefore, the Schmitt trigger circuit according to the present invention is less affected by noise in the input voltage $V_{IN}$ due to the low base voltage of the transistor T5.

Further, the present invention is not limited to these embodiments, but various variations and modifications may be made without departing from the scope of the present invention.

What is claimed is:

1. A Schmitt trigger circuit for outputting an output voltage having a logic level which changes from a low level to a high level at a first threshold value of an input voltage and which changes from the high level to the low level at a second threshold value of the input voltage, said Schmitt trigger circuit comprising:
    a first transistor for inversion having a base supplied with the input voltage and having an emitter voltage;
    a level shift diode, coupled to said first transistor, for shifting the emitter voltage of said first transistor from a reference level, said level shift diode having an anode and a cathode;
    a second transistor for switching, having a collector and an emitter respectively coupled to the anode and the cathode of said level shift diode, the emitter of said second transistor being coupled to a first power source voltage, said second transistor having a base;
    switching means for controlling switching of said second transistor, said switching means being coupled between the base of said second transistor and a second power source voltage higher than the first power source voltage; and
    an output circuit, coupled to said first transistor and supplied with the input voltage through said first transistor, for outputting the output voltage, said output circuit being coupled between the first and second power source voltages, said switching means being controlled responsive to the output voltage from said output circuit so as to close when the logic level of the output voltage is the high level, thereby turning said second transistor ON.

2. A Schmitt trigger circuit as claimed in claim 1, wherein said output circuit has an output terminal, and third and fourth transistors, said third and fourth transistors each having an emitter and a collector thereof coupled between the first and second power source voltages, said third transistor having a base supplied with the input voltage through said first transistor, said fourth transistor having a base coupled to the emitter of said third transistor and a collector coupled to the output terminal providing the output voltage.

3. A Schmitt trigger circuit as claimed in claim 2, wherein said switching means is coupled to the collector of said third transistor so as to be controlled responsive to a voltage which is obtained from the collector of said third transistor.

4. A Schmitt trigger circuit as claimed in claim 2, wherein said switching means is controlled responsive to a voltage which is obtained from the collector of said fourth transistor.

5. A Schmitt trigger circuit as claimed in claim 1, further comprising a resistor coupled between the emitter of said second transistor and the first power source voltage, said resistor having a resistance value such that the second threshold value is increased.

6. A Schmitt trigger circuit for outputting an output voltage having a logic level which changes from a low level to a high level at a first threshold value of an input voltage and which changes from the high level to the low level at a second threshold value of the input voltage, said Schmitt trigger circuit comprising:
    a first transistor for inversion having a base supplied with the input voltage and having an emitter voltage;
    a level shift diode, coupled to said first transistor, for shifting the emitter voltage of said first transistor from a reference level, said level shift diode having an anode and a cathode;
    a second transistor for switching having a collector and an emitter respectively coupled to the anode and the cathode of said level shift diode, the emitter of said second transistor being coupled to a first power source voltage, said second transistor having a base;
    switching means for controlling switching of said second transistor by supplying a control voltage to the base of said second transistor, said switching means being coupled between the first power source voltage and a second power source voltage higher than the first power source voltage; and
    an output circuit, coupled to said first transistor and supplied with the input voltage through said first transistor, for outputting the output voltage, said output circuit being coupled between the first and second power source voltages, said switching means being controlled responsive to the output voltage from said output circuit so as to turn said second transistor ON by the control voltage when the logic level of the output voltage is the high level.

7. A Schmitt trigger circuit as claimed in claim 6, wherein said output circuit has an output terminal, and third and fourth transistors, said third and fourth transistors each having an emitter and a collector thereof coupled betweent he first and second power source voltages, said third transistor having a base supplied with the input voltage through said first transistor, said fourth transistor having a base coupled to the emitter of said third transistor and the collector coupled to the output terminal providing the output voltage.

8. A Schmitt trigger circuit as claimed in claim 7, wherein said output circuit further comprises fifth and sixth transistors and firt and second resistors, said first and second resistors coupled to the second power source voltage, said fifth transistor having a base coupled to the collector of said third transistor and to the second power source voltage through said first resistor, having a collector coupled to the second power source voltage through said second resistor, and having an emitter coupled to the first power source voltage through said switching means, said sixth transistor having a base coupled to the emitter of said fifth transistor, having a collector coupled to the second power source voltage through said second resistor, and having an emitter coupled to the collector of said fourth transistor, the output voltage of said Schmitt trigger circuit being obtained from the emitter of said sixth transistor.

9. A Schmitt trigger circuit as claimed in claim 8, wherein said switching means comprises a voltage divider.

10. A Schmitt trigger circuit as claimed in claim 9, wherein said voltage divider includes third and fourth resistors coupled in series between the first power source voltage and the emitter of said fifth transistor, the control voltage being obtained from a connection point of said third and fourth resistors.

11. A Schmitt trigger circuit as claimed in claim 6, further comprising an input circuit including a resistor coupled to the second power source voltage, first and second diodes and a third transistor, said first diode having an anode coupled to the second power source voltage through said resistor and a cathode coupled to the base of said first transistor, said second diode having an anode coupled to the base of said first transistor and a cathode coupled to a base of said third transistor, said third transistor having an emitter coupled to the anode of said first diode and a collector coupled to the first power source voltage, the input voltage being applied to the base of said firt transistor through said input circuit.

12. A Schmitt trigger circuit as claimed in claim 6, further comprising an input circuit including a resistor coupled to the second power source voltage, first, second and third diodes, said first diode having an anode coupled to the second power source voltage through said resistor and a cathode coupled to the base of said first transistor, said second diode having an anode coupled to the base of said first transistor, said third diode having an anode coupled to the anode of said first diode and a cathode coupled to the cathode of said second diode, the input voltage being applied to the base of said first transistor through said input circuit.

13. A Schmitt trigger circuit as claimed in claim 6, further comprising a resistor coupled between the emitter of said second transistor and the first power source voltage, said resistor having a resistance value such that the second threshold value increases.

14. A Schmitt trigger circuit for outputting an output voltage having a logic level which changes from a low level to a high level at a first threshold value of an input voltage and which changes from the high level to the low level at a second threshold value of the input voltage, said Schmitt trigger comprising:
a first transistor for inversion having a base supplied with the input voltage and having an emitter voltage;
a level shift diode, coupled to said first transistor, for shifting the emitter voltage of said first transistor from a reference level, said level shift diode having an anode and a cathode;
a second transistor for switching having a collector and an emitter respectively coupled to the anode and the cathode of said level shift diode, the emitter of said second transistor being coupled to a first power source voltage, said second transistor having a base;
switching means for controlling switching of said second transistor by supplying a control voltage to a base of said second transistor, said switching means being coupled between the base of said second transistor and a second power source voltage higher than the first power source voltage; and
an output circuit, coupled to said first transistor and supplied with the input voltage through said first transistor, for outputting the output voltage, said output circuit being coupled between the first and second power source voltages, said switching means being controlled responsive to the output voltage from said output circuit so as to turn said second transistor ON by the control voltage when the logic level of the output voltage is the high level.

15. A Schmitt trigger circuit as claimed in claim 14, wherein said switching means includes a third transistor having a base coupled to the second power source voltage and an emitter coupled to said output circuit, and diode means having an anode side coupled to a collector of said third transistor and a cathode side coupled to the base of said second transistor.

16. A Schmitt trigger circuit as claimed in claim 15, further comprising a resistor coupled between the base of said third transistor and the second power source voltage.

17. A Schmitt trigger circuit as claimed in claim 15, wherein said output circuit includes an output terminal, and fourth and fifth transistors, said fourth and fifth tansistors each having an emitter and a collector thereof coupled between the first and second power source voltages, said fourth transistor having a base supplied with the input voltage through aid first transistor, said fifth transistor having a base coupled to the emitter of said fourth transistor and a collector coupled to the output terminal providing the output voltage.

18. A Schmitt trigger circuit as claimed in claim 17, wherein the emitter of said third transistor is coupled to the collector of said fourth transistor.

19. A Schmitt trigger circuit as claimed in claim 14, further comprising a resistor coupled between the emitter of said second transistor and the first power source voltage, said resistor having a resistance value such that the second threshold value increases.

20. A Schmitt trigger circuit for outputting an output voltage having a logic level which changes from a first level to a second level at a first threshold value of an input voltage, and which changes from the second level to the first level at a second threshold value of the input voltage, comprising:
- a first transistor having a base supplied with the input voltage and having an emitter voltage;
- a level shift diode, coupled to said first transistor, for shifting the emitter voltage of said first transistor from a reference level, said level shift diode having an anode and a cathode;
- a second transistor having a collector and an emitter respectively coupled to the anode and the cathode of said level shift diode, having an emitter coupled to a first power source voltage, and having a base, said second transistor having a switched state;
- switching means for controlling switching of said second transistor, said switching means coupled between the base of said second transistor and a second power source voltage higher than the first power source voltage; and
- an output circuit, coupled to said first transistor and supplied with the input voltage through said first transistor, for outputting the output voltage, said switching means being controlled responsive to the output voltage from said output circuit so as to be in a first switching state when the logic level of the output voltage is the second level, so as to cause said second transistor to be in the switched state.

* * * * *

UNITED STATES PATENT AND TRADEMARK OFFICE
CERTIFICATE OF CORRECTION

PATENT NO. : 4,883,975

DATED : NOVEMBER 28, 1989

INVENTOR(S) : HIROMU ENOMOTO ET AL.

It is certified that error appears in the above-identified patent and that said Letters Patent is hereby corrected as shown below:

Col. 1, line 40, "T*," should be --T8--.

Col. 2, line 65, "theinput" should be --the input--.

Col. 3, line 24, delete "a";
line 47, "comopared" should be --compared--.

Col. 6, line 7, "fromo" should be --from--;
line 52, "teh" should be --the--.

Col. 8, line 57, "tranisstor" should be --transistor--.

Col. 11, line 10, "betweent he" should be --between the--;
line 18, "firt" should be --first--;
line 55, "firt" should be --first--.

Col. 12, line 59, "aid" should be --said--.

Signed and Sealed this

Thirtieth Day of October, 1990

*Attest:*

HARRY F. MANBECK, JR.

*Attesting Officer*  *Commissioner of Patents and Trademarks*